(12) United States Patent
Unger et al.

(10) Patent No.: US 7,130,032 B2
(45) Date of Patent: Oct. 31, 2006

(54) ALTERNATE TEST METHOD FOR RF CABLE TESTING TO AVOID LONG TEST CABLES

(75) Inventors: Glenn Gary Unger, Great Neck, NY (US); Stephen Robert Suarez, Ronkonkoma, NY (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 11/078,804

(22) Filed: Mar. 11, 2005

(65) Prior Publication Data

US 2006/0203227 A1   Sep. 14, 2006

(51) Int. Cl.
G01N 21/00 (2006.01)
(52) U.S. Cl. .................................... 356/73.1
(58) Field of Classification Search ............... None
See application file for complete search history.

(56) References Cited

U.S. PATENT DOCUMENTS

| | | | |
|---|---|---|---|
| 3,104,354 A | 9/1963 | Weinschel et al. | |
| 4,219,770 A | 8/1980 | Weinert | |
| 4,995,267 A * | 2/1991 | Mikheev et al. | 73/8 |
| 5,128,619 A | 7/1992 | Bjork et al. | |
| 5,410,163 A * | 4/1995 | Murakami | 257/48 |
| 5,646,541 A | 7/1997 | Ninomiya | |
| 5,821,760 A | 10/1998 | Koeman et al. | |
| 5,978,449 A | 11/1999 | Needle | |
| 6,259,256 B1 | 7/2001 | Walling | |
| 6,417,672 B1 | 7/2002 | Chong | |
| 6,423,981 B1 * | 7/2002 | Nayler | 257/48 |
| 6,437,578 B1 | 8/2002 | Gumm | |
| 6,459,478 B1 | 10/2002 | Schmidt et al. | |
| 6,529,844 B1 | 3/2003 | Kapetanic et al. | |
| 6,653,848 B1 | 11/2003 | Adamian et al. | |
| 6,661,237 B1 | 12/2003 | Teich | |
| 2002/0039404 A1 | 4/2002 | Murphree et al. | |
| 2002/0089337 A1 | 7/2002 | Lowell et al. | |
| 2003/0147508 A1 | 8/2003 | Faulkner | |
| 2003/0164710 A1 | 9/2003 | Schmidt | |
| 2003/0235274 A1 | 12/2003 | Afzal | |
| 2004/0046570 A1 | 3/2004 | Teich | |
| 2004/0114527 A1 | 6/2004 | Faulkner et al. | |
| 2004/0140813 A1 | 7/2004 | Bolouri-Saransar et al. | |
| 2004/0201383 A1 | 10/2004 | Anderson | |

* cited by examiner

*Primary Examiner*—Tu T. Nguyen
(74) *Attorney, Agent, or Firm*—Robert P. Lenart, Esq.; Pietragallo, Bosick & Gordon LLP

(57) ABSTRACT

A method is provided for measuring insertion loss in cables. The method comprises the steps of measuring a first insertion loss $IL_{12}$ of a first circuit path including the series connection of a first cable and a second cable, measuring a second insertion loss $IL_{23}$ of a second circuit path including the series connection of the second cable and a third cable, measuring a third insertion loss $IL_{13}$ of a third circuit path including the series connection of the first cable and the third cable, and calculating an insertion loss of three or more cables using the formulas:

$$IL_1 = \frac{IL_{12} - IL_{23} + IL_{13}}{2}$$

$$IL_3 = IL_{13} - IL_1$$

$$IL_2 = IL_{23} - IL_3$$

$$IL_n = IL_{3n} - IL_3$$

Where n is the number of cables to be tested.

12 Claims, 2 Drawing Sheets

ALTERNATE TEST METHOD FOR RF CABLE TESTING TO AVOID LONG TEST CABLES

FIELD OF THE INVENTION

This invention relates to methods for testing electrical components, and more particularly to methods for testing electrical cables where the endpoints of the cables or Units Under Test are not physically located close to each other.

BACKGROUND OF THE INVENTION

In most RF systems, it is common to test cable paths within the system to verify that the cables are capable of signal transmission with minimal degradation. An example of a typical RF cable measurement would be an insertion loss measurement. Insertion loss provides a measure of the power loss along a transmission line and is typically measured in dB. Insertion loss varies with the type of cable, operating frequency, and cable length.

Insertion loss measurements can be used to troubleshoot or to verify cable performance. A common instrument for performing these measurements is a vector network analyzer (VNA). Vector network analyzers can measure and display the complete amplitude and phase characteristics of an electrical network. VNA hardware typically includes a sweeping signal source, a test set to separate forward and reverse signals, and a phase-coherent receiver.

Scattering Parameters, or s-parameters, are the reflection and transmission coefficients between the incident and reflection waves. They are used to describe the behavior of a device under linear conditions at radio frequencies. Each parameter is typically characterized by magnitude, decibel and phase. The expression in decibel is 20log(Sij) because s-parameters are voltage ratios of the waves. For a two port network, S11 is the reflection coefficient of the input, S21 is the forward transmission gain, S12 is the reverse transmission gain, and S22 is the reflection coefficient of the output. S12 and S21 measurements (such as Insertion Loss, Time Delay Matching, and Phase Matching) using a VNA usually involve two test cables. After calibrating out the errors due to the VNA, test cables and adapters, one test cable is connected between a first port on the VNA (Port 1) and one end of the cable under test. A second test cable is connected between a second port of the VNA (Port 2) and the other end of the cable under test. Where the endpoints of the cables or Units Under Test are not physically located close to each other, or the test cables have to be routed around obstructions, longer test cables than desired or practical may be necessary to perform S12 or S21 measurements.

If the length of the test cables significantly exceeds the length of the cables to be tested, the errors introduced by the test cables can begin to cause inaccuracies in the measurements. In many cases, the cables to be tested are installed in equipment, such as an aircraft, and cannot be easily removed.

It would normally be feasible to test short cables by the standard method of attaching a test cable to each side of the cable under test. However, in some instances, such as when testing cables in an aircraft, long test cables would be required so that connections can be made to the ends of the cables under test. Traditional test methods for testing RF cabling that utilize long test cables are expensive due to additional test cable requirements for ruggedness and other cable characteristics. Long test cables have greater insertion loss as well as phase and insertion loss stability problems, and also create potential safety hazards. For example, there is an increased chance of a person tripping over the test cable and causing Foreign Object Debris (FOD) damage or personal injury. Long test cables also result in an increased risk of the test cable being damaged by oil or grease, or being run over or stepped on. In addition, long test cables can be intrusive on other tasks being performed in the immediate area.

There is a need for a cable test method that eliminates the need for long test cables.

SUMMARY OF THE INVENTION

This invention provides a method for measuring insertion loss in cables. For the specific case of a cable run including three parallel, similar cables, the method comprises the steps of measuring a first insertion loss $IL_{12}$ of a first circuit path including the series connection of a first cable and a second cable, measuring a second insertion loss $IL_{23}$ of a second circuit path including the series connection of the second cable and a third cable, measuring a third insertion loss $IL_{13}$ of a third circuit path including the series connection of the first cable and the third cable, and calculating an insertion loss $IL_1$ of the first cable using the formula:

$$IL_1 = \frac{IL_{12} - IL_{23} + IL_{13}}{2}.$$

The method can further comprise the steps of calculating an insertion loss $IL_3$ of the third cable using the formula $IL_3 = IL_{13} - IL_1$, and calculating an insertion loss $IL_2$ of the second cable using the formula $IL_2 = IL_{23} - IL_3$.

The method can also be extended to include additional n cables by measuring the insertion loss of a series connection of the nth cable and the third cable $IL_{3n}$ and calculating all subsequent insertion losses $IL_n = IL_{3n} - IL_3$.

In another aspect, the invention provides a method of measuring characteristics of electrical components, the method comprising the steps of measuring a first characteristic $S_{12}$ of a first circuit path including the series connection of a first electrical component and a second electrical component, measuring a second characteristic $S_{23}$ of a second circuit path including the series connection of the second electrical component and a third electrical component, measuring a third characteristic $S_{13}$ of a third circuit path including the series connection of the first electrical component and the third electrical component, and calculating a characteristic $S_1$ of the first electrical component using the formula:

$$S_1 = \frac{S_{12} - S_{23} + S_{13}}{2}.$$

The electrical components can include, for example, power dividers or splitters. The measured characteristics can include, for example, phase and phase match.

DETAILED DESCRIPTION OF THE INVENTION

Where parallel cable paths exist, it is possible to eliminate the need for long test cables by using various combinations of cables under test and algebraically solving for the desired parameters. As used in this description, Parallel Cables or Cable Paths means three or more cables with compatible frequency ranges of operation. The physical endpoints of the cables should be located near enough to each other so that the same relatively short test cables, item numbers 18 and 20 on FIGS. 1 through 5, can be connected between the VNA Ports and the endpoints of the cables to be tested and the same relatively short wraparound cable, item number 26 on FIGS. 1 through 5, can be connected to the other ends of the cables under test.

Figure 1:
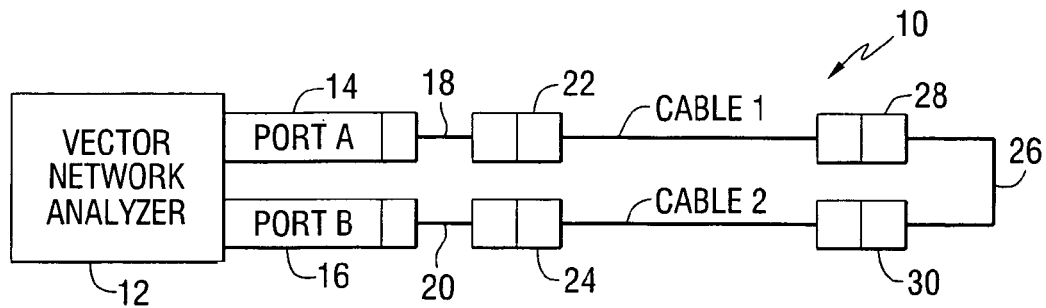
FIGS. 1 through 5 are schematic diagrams of test circuits used to practice the method of the invention.

FIG. 1 is a schematic representation of a test circuit 10 used to practice the method of the invention. A vector network analyzer (VNA) 12 includes two ports 14 and 16 connected to test cables 18 and 20. Test cable 18 is connected to a proximal end of a first cable to be tested, referred to as Cable 1, by a connector 22. Test cable 20 is connected to a proximal end of a second cable to be tested, referred to as Cable 2, by a connector 24. The distal ends of Cables 1 and 2 are connected to each other by a wraparound cable 26 using connectors 28 and 30. The vector network analyzer (VNA) is used to measure the insertion loss of the cable path that includes the series connection of Cables 1 and 2. The VNA can be any commercially available VNA. VNAs are commonly used to measure insertion loss.

The insertion loss in the cable path that includes Cables 1 and 2 is identified as $IL_{12}$. The cables to be tested can be mounted in harnesses or connector shells, or routed in such a way where bending them may not be possible. Also, bending cables may not be possible where they cannot physically reach each other. Furthermore, depending on the type of cable and cable characteristics being measured, bending can degrade and sometimes destroy certain cable properties such as Phase Match, and Insertion Loss, or VSWR.

Figure 2:
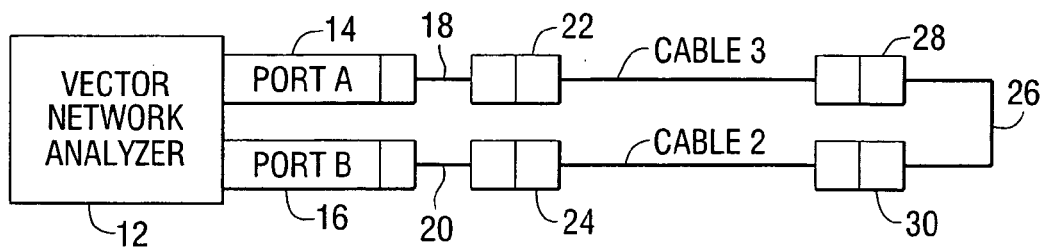

FIG. 2 is a schematic representation of the test circuit wherein Cable 1 has been replaced by Cable 3. In this arrangement, the vector network analyzer is used to measure the insertion loss of the cable path including the series connection of Cables 3 and 2. The insertion loss in this cable path is identified as $IL_{32}$. This analysis assumes the use of the same test cables, connectors, and wraparound cables for all of the tests.

Figure 3:
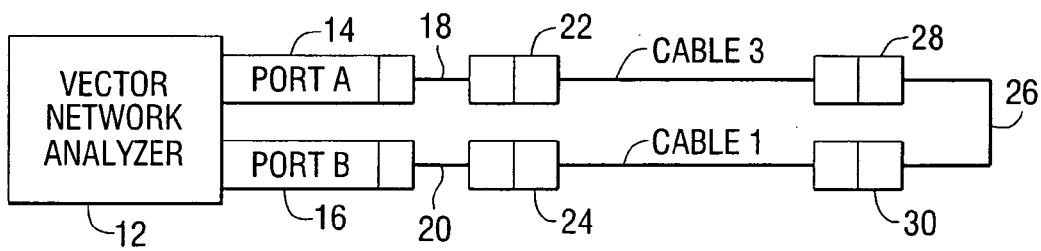

FIG. 3 is a schematic representation of the test circuit wherein Cables 3 and 1 are connected to the test ports of the vector network analyzer. In this arrangement, the vector network analyzer is used to measure the insertion loss of the cable path including the series connection of Cables 3 and 1. The insertion loss in this cable path is identified as $IL_{13}$.

Figure 4:
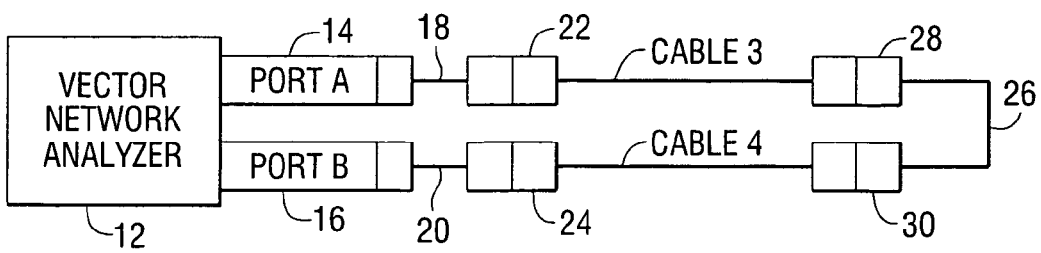

FIG. 4 is a schematic representation of the test circuit wherein Cables 3 and 4 are connected to the test ports of the vector network analyzer. In this arrangement, the vector network analyzer is used to measure the insertion loss of the cable path including the series connection of Cables 3 and 4. The insertion loss in this cable path is identified as $IL_{34}$.

Figure 5:
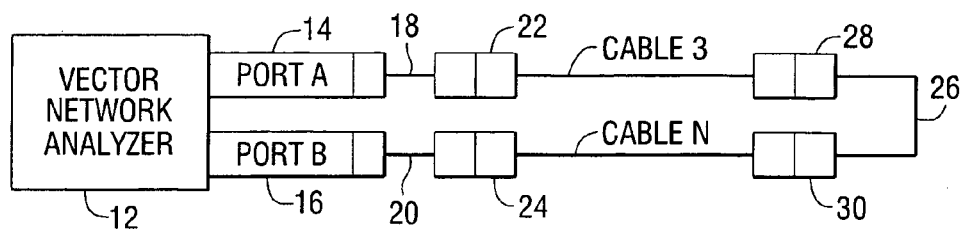

FIG. 5 is a schematic representation of the test circuit wherein Cable 3 and another cable referred to as Cable N are connected to the test ports of the vector network analyzer. In this arrangement, the vector network analyzer is used to measure the insertion loss of the cable path including the series connection of Cables 3 and N. The insertion loss in this cable path is identified as $IL_{3N}$.

The method of this invention uses short test cables that are less expensive and have less stringent requirements for insertion loss, ruggedness, and stability than long cables. This results in a lower chance of the test cables causing damage or being damaged during use. In addition, short cables are less intrusive to other tasks being performed in the area.

Figure 6:
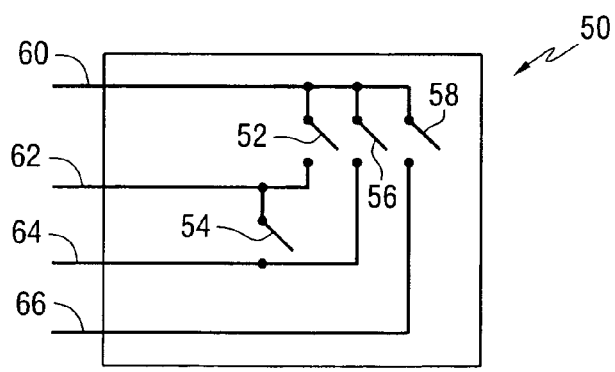
FIG. 6 is a schematic representation of a switch matrix that can be used to practice the method of the invention.

Large numbers of cable paths could be broken down in smaller, more easily managed groups. In an alternative test configuration, a calibrated RF switching matrix can be used to avoid the need to make multiple wraparound cable connections and disconnections during the test. FIG. 6 is a schematic diagram of a switch matrix 50 that can be used to connect the ends of a plurality of cables to each other. This switch matrix includes a plurality of circuit paths that include switches 52, 54, 56 and 58 that can be used to provide wraparound connections similar to those of FIGS. 1–4.

The wraparound paths of the switch matrix can be connected to the cables to be tested and the switches can be operated to connect the cables in various test configurations. The distal end of Cable 1 would be connected to line 60, the distal end of Cable 2 would be connected to line 62, the distal end of Cable 3 would be connected to line 64, and the distal end of Cable 4 would be connected to line 66. Switch 52 would be closed to form the circuit of FIG. 1. Switch 54 would be closed to form the circuit of FIG. 2. Switch 56 would be closed to form the circuit of FIG. 3. Switches 56 and 58 would be closed to form the circuit of FIG. 4.

The switch characteristics could be calibrated out or switches with known calibrated characteristics could be used. The known characteristics with their tolerance could then be added to the equations that are used to determine the desired characteristics of the cables under test. The way that the switch characteristics are handled would depend on how the matrix is implemented and what assumptions are made. Alternatively, the switch could include a self-calibration wrap. In addition, the switches could be manually operated, computer controlled, or otherwise automated. One way to calibrate the switch matrix would be to connect it directly to the test cables from the VNA and perform a VNA calibration without the cable under test in the path. Then the measured insertion loss can be modified by this measurement.

The circuit paths of the switch matrix can be matched paths or paths with known characteristics that can be included in the test equations. The switches in the wrapping matrix could be internal to a system design or connected to the system externally during testing. The switch matrix could be used in conjunction with or as part of a built-in test system to verify performance and/or to develop system correction factors to be used during normal system operation.

This invention is not limited to any specific system. A system generated test signal could be routed using a switch matrix to perform the measurements in an automated fashion. This would require the system to be modified or designed to take advantage of this measurement technique.

In addition, this invention is not limited to end user implementation. The method could be built into test measurement equipment, such as a Network Analyzer, in a clear, user friendly, manner specific to this application. Instructions, in words or a Graphical User Interface, could then be used to guide an operator in performing the test setups and interconnections. The instrument would then perform the necessary calculations, display the results on one or more screens, or format the results for data download. If this was built into an instrument or system, it would alleviate the need for an end user to automate this functionality.

A particular application of the invention can be used for automatic cable testing of four parallel RF paths. The method could be extended to include any number of cable paths greater then 3. The cables to be measured in this instance were up to 65 feet long and traversed the length of an aircraft. Cables were already installed in the aircraft making removal difficult. Testing of this type is done in a maintenance environment, so ease of measurement and speed of test are important considerations. A vector network analyzer under control of a personal computer via a general purpose interface bus (GPIB) link was used to perform all calculations.

The following description describes a use of the invention for measuring insertion loss. The definitions used in the following description are as follows: $IL_1$, $IL_2$, $IL_3$, and $IL_4$ are the actual insertion losses of cables; and $IL_{12}$, $IL_{13}$, $IL_{23}$, and $IL_{34}$ are the measured insertion losses of cable paths 1–2, 1–3, 2–3, and 3–4 respectively.

After all measurements are completed, the following equations are used to obtain the actual insertion loss $IL_n$ of all cables under test:

$$IL_1 = \frac{IL_{12} - IL_{23} + IL_{13}}{2} \quad (1)$$

$$IL_3 = IL_{13} - IL_1 \quad (2)$$

$$IL_2 = IL_{23} - IL_3 \quad (3)$$

$$IL_4 = IL_{34} - IL_3 \quad (4)$$

While the example illustrated by equations (1) through (4) measures a group of four RF cables, the method can be applied to any group of three or more cables. To extend the method to an arbitrary number of cables, N, the test setups of FIGS. 1–3 can be used to measure $IL_{12}$, $IL_{13}$, and $IL_{23}$. Then an insertion loss $IL_{3N}$ can be measured using the setup of FIG. 4 for all remaining cable paths (where N=number of cables to be tested and $IL_{3N}$ is the combined measured insertion loss of cable 3 and cable N in series). Then insertion loss values $IL_1$, $IL_2$, and $IL_3$ can be determined using equations (1), (2), and (3) above, and insertion loss value $IL_N$ can be calculated for each of the remaining cables using the following equation (where $IL_N$ is the actual insertion loss of each cable N):

$$IL_N = IL_{3N} - IL_3 \quad (5)$$

Therefore this method of this invention can be easily scaled.

By using the method of this invention, only relatively short and easily obtainable RF test cables would be required. A computer controller can be used to allow the calculations to be done with a minimum of effort.

Similar methods can be used for determining other S12 and S21 type measurements such as phase and phase match between cable paths. The invention can also be used to characterize or test systems with devices in the system paths. Such devices can include, for example, power dividers or splitters.

In addition to RF cables, this method could be used to perform link loss tests of fiber optics cables. Short test cables have a lower failure rate as long test cables. This method could improve maintenance costs in so far as there would be fewer inaccurate results due to faulty test cables. The other S12 and S21 parameters could be tested by substituting the desired parameter for insertion loss in the preceding discussion.

For measuring other characteristics, S, of electrical components, the equations would be modified as:

$$S_1 = \frac{S_{12} - S_{23} + S_{13}}{2} \quad (6)$$

$$S_3 = S_{13} - S_1 \quad (7)$$

$$S_2 = S_{23} - S_3 \quad (8)$$

$$S_4 = S_{34} - S_3 \quad (9)$$

$$S_N = S_{3N} - S_3 \quad (10)$$

While the invention has been described in terms of several examples, it will be apparent to those skilled in the art that various changes can be made to the described examples without departing from the scope of the invention as defined by the following claims.

What is claimed is:

1. A method of measuring insertion loss in cables, the method comprising the steps of:
    measuring a first insertion loss $IL_{12}$ of a first circuit path including the series connection of a first cable and a second cable;
    measuring a second insertion loss $IL_{23}$ of a second circuit path including the series connection of the second cable and a third cable;
    measuring a third insertion loss $IL_{13}$ of a third circuit path including the series connection of the first cable and the third cable; and
    calculating an insertion loss $IL_1$ of the first cable using the formula:

$$IL_1 = \frac{IL_{12} - IL_{23} + IL_{13}}{2}.$$

2. The method of claim 1, further comprising the steps of:
    calculating an insertion loss $IL_3$ of the third cable using the formula:

$IL_3 = IL_{13} - IL_1$; and calculating an insertion loss $IL_2$ of the second cable using the formula:

$IL_2 = IL_{23} - IL_3$.

3. The method of claim 2, further comprising the steps of:
    measuring a fourth insertion loss $IL_{34}$ of a fourth circuit path including the series connection of the third cable and a fourth cable; and
    calculating an insertion loss $IL_4$ of the fourth cable using the formula:

$IL_4 = IL_{34} - IL_3$.

4. The method of claim 2, further comprising the steps of:
    measuring an nth insertion loss $IL_{3n}$ of an nth circuit path including the series connection of the third cable and an nth cable; and
    calculating an insertion loss $IL_n$ of the nth cable using the formula:

$IL_n = IL_{3n} - IL_3$.

5. The method of claim 1, wherein each of the cables comprises:
an electrical cable.

6. The method of claim 1, wherein each of the cables comprises:
a fiber optic cable.

7. A method of measuring characteristics of electrical components, the method comprising the steps of:
measuring a first characteristic $S_{12}$ of a first circuit path including the series connection of a first electrical component and a second electrical component;
measuring a second characteristic $S_{23}$ of a second circuit path including the series connection of the second electrical component and a third electrical component;
measuring a third characteristic $S_{13}$ of a third circuit path including the series connection of the first electrical component and the third electrical component; and
calculating a characteristic $S_1$ of the first electrical component using the formula:

$$S_1 = \frac{S_{12} - S_{23} + S_{13}}{2}.$$

8. The method of claim 7, further comprising the steps of:
calculating a characteristic $S_3$ of the third electrical component using the formula:

$S_3 = S_{13} - S_1$; and calculating a characteristic $S_2$ of the second electrical component using the formula:

$S_2 = S_{23} - S_3$.

9. The method of claim 8, further comprising the steps of:
measuring a fourth characteristic $S_{34}$ of a fourth circuit path including the series connection of the third electrical component and a fourth electrical component; and
calculating a characteristic $S_4$ of the fourth electrical component using the formula:

$S_4 = S_{34} - S_3$.

10. The method of claim 8, further comprising the steps of:
measuring an nth characteristic $S_{3n}$ of an nth circuit path including the series connection of the third electrical component and an nth electrical component; and
calculating a characteristic $S_n$ of the nth electrical component using the formula:

$S_N = S_{3N} - S_3$.

11. The method of claim 7, wherein each of the electrical components comprises:
an electrical cable.

12. The method of claim 7, wherein each of the electrical components comprises:
a fiber optic cable.

* * * * *